(12) United States Patent
Hirohama

(10) Patent No.: US 6,245,621 B1
(45) Date of Patent: Jun. 12, 2001

(54) SEMICONDUCTOR DEVICE MANUFACTURING METHOD

(75) Inventor: Kazuhiro Hirohama, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/637,579

(22) Filed: Aug. 14, 2000

(30) Foreign Application Priority Data

Jan. 31, 2000 (JP) .................................................. 12-021327

(51) Int. Cl.⁷ .................................................. H01L 21/336
(52) U.S. Cl. ........................ 438/303; 438/239; 438/395
(58) Field of Search .................................. 438/303, 305, 438/306, 239, 241, 253, 256, 396, 399, 571, 597, 618, 622, 637, 638, 639, 640

(56) References Cited

U.S. PATENT DOCUMENTS

| | | | | |
|---|---|---|---|---|
| 6,057,581 | * | 5/2000 | Doan | 257/401 |
| 6,100,138 | * | 8/2000 | Tu | 438/253 |
| 6,117,733 | * | 9/2000 | Sung et al. | 438/265 |

* cited by examiner

*Primary Examiner*—David Nelms
*Assistant Examiner*—David Vu
(74) *Attorney, Agent, or Firm*—Nixon & Vanderhye, P.C.

(57) ABSTRACT

A method for manufacturing a semiconductor device, comprises steps of: (a) forming a gate insulating film on a semiconductor substrate and forming a plurality of gate electrodes having a first insulating film made of a first insulating material thereon and a sidewall spacer made of the first insulating material on its sidewall on said gate insulating film; (b) forming a second insulating film which is made of the first insulating material and which is thinner than said first insulating film on said semiconductor substrate at least in a region where a contact hole is to be formed in the later step; (c) embedding a third insulating film which may become an etching stopper to etching of said first insulating material between said gate electrodes; (d) forming a first resist pattern having a predetermined shape on said semiconductor substrate and etching said second insulating film, first insulating film and sidewall spacer until when said gate electrode is exposed by using said first resist pattern and said third insulating film as mask; (e) forming an interlayer insulating film on said semiconductor substrate; (f) forming a second resist pattern having a predetermined shape on said interlayer insulating film and exposing said second insulating film by etching using said second resist pattern as a mask; and (g) forming the contact hole by removing said second insulating film.

8 Claims, 13 Drawing Sheets

SEMICONDUCTOR DEVICE MANUFACTURING METHOD

CROSS-REFERENCE TO RELATED APPLICATION

This application is related to Japanese application No. 2000-21327 filed on Jan. 31, 2000, whose priority is claimed under 35 USC §119, the disclosure of which is incorporated by reference in its entirety.

BACKGROUND OF THE INVENTION

1. Field of the Invention

The present invention relates to a method for manufacturing a semiconductor device and more specifically to a method for manufacturing a semiconductor device comprising a step of forming a contact hole extending from a gate electrode to a semiconductor substrate and/or device isolation region or a self-aligned contact hole to a semiconductor substrate between closely arranged gate electrodes.

2. Description of Related Art

With the advance of integration and performance of semiconductor devices, the design rule of its gate electrode has been also reduced to quarter micron or less and a source/drain region of a transistor has been narrowed, so that it has become difficult to form a contact hole.

Then, the following methods have been adopted in manufacturing a highly integrated semiconductor device, or SRAM in particular, by devising its layout. That is, a gate electrode is connected with a source/drain region of a transistor by one contact hole (shared contact hole), a contact hole extending from the source/drain region to the device isolation region (borderless contact hole), and/or a contact hole is formed on the source/drain region between closely arranged gate electrodes by means of SAC (self-aligned contact) method, for example.

In order to form the contact hole as described above, while the gate electrodes and the device isolation region which becomes the borderless section must be covered by a silicon nitride film which functions as an etching stopper in opening the contact hole by using the SAC method, a contact hole must be opened through the silicon nitride film on the gate electrode in the region where the shared contact hole is formed or the contact hole is formed on the gate electrode before etching the contact hole by SAC method.

As a method for opening the contact hole on the gate electrode covered by such silicon nitride film, there has been a method of forming a photoresist layer on the silicon nitride film by means of photolithography and of opening the contact hole by dry-etching by using the photoresist layer as a mask. It may be relatively easily carried out when the width of the gate electrode is wide and there is an enough margin of alignment.

However, when the width of the gate electrode is narrowed to accommodate with the high integration, it becomes difficult to align the mask in the photolithography and a part of a contact hole pattern of the photoresist layer extends over the source/drain region or the device isolation region.

When the dry-etching is carried out in this state, etching damage occurs on the semiconductor substrate in addition to etching-off of the silicon nitride film provided for the SAC method on the source/drain region. Etching-off of the silicon nitride film provided for the SAC method also occurs in the device isolation region. As a result, a large amount of etching loss of a silicon oxide film which is a device isolation film is produced during the SAC processing.

FIG. 11(a) through FIG. 13(c) show exemplary conventional semiconductor device manufacturing methods for opening a contact hole on a gate electrode covered by a silicon nitride film. FIG. 11(a) to FIG. 11(c) is a section view in which the contact hole is located only on source/drain regions 41 and 42 and FIGS. 12(a) to 12(c) and FIGS. 13(a) to 13(b) are section views in which the contact hole is located on the source/drain regions 41 and 42 and a device isolation region 32. The reference numeral 41 denotes a high-concentrate source/drain regions and 42 a low-concentrate source/drain regions.

The device isolation region 32 is formed on a silicon substrate 31. Then, a poly-crystal silicon film 34, a tungsten silicide film 35, an oxide film 36 and a silicon nitride film 37 are formed after forming a gate oxide film 33 and a gate electrode is formed by means of photolithography and dry-etching.

Then, the silicon nitride film is formed on the whole surface and etch-back is carried out to form a silicon nitride film sidewall 38 on the side of the gate electrode. A silicon nitride film 39 which becomes an etching stopper during the SAC method is formed on the whole surface (FIG. 11(a) and FIG. 12(a)).

After covering the gate electrode by the silicon nitride film, a resist mask 41 for opening the contact hole on the gate electrode is formed by means of photolithography. However, when the width of the gate electrode is narrow, it is difficult to register the mask by the lithography and a part of the contact hole pattern of the photoresist layer extends over the source/drain regions 41 and 42 or the device isolation region 32 (FIG. 11(b) and FIG. 12(b)).

When the dry-etching is carried in this state, the etching damages the semiconductor substrate 31, in addition of etching-off of the silicon nitride film provided for the SAC processing, in the source/drain regions 41 and 42 (FIG. 11(c) and FIG. 12(c)).

Etching-off of the silicon nitride film provided for the SAC method occurs also in the device isolation region 32. As a result, a large amount of etching loss of the oxide film which is the device isolation film occurs by the dry-etching using a SAC pattern photoresist layer 44 (FIG. 13(a)) after forming an interlayer insulating film 43 (FIG. 13(b)).

FIG. 13(c) is a step section view after carrying out the SAC etching and removal of the photoresist.

Thus, when the misalignment of the mask occurs in the lithography in forming the contact hole on the gate electrode covered by the silicon nitride film, the part of the contact hole pattern of the photoresist extends over the source/drain regions or the device isolation region. Then, the source/drain regions are damaged by the etching, the etching-off of the silicon nitride film which becomes an etching stopper during the SAC method as well as the large amount of loss of the silicon oxide film during the SAC method thereafter have occurred, thus causing problems such as junction leak.

SUMMARY OF THE INVENTION

In view of the drawbacks of the prior art, the present invention provides a method for manufacturing a semiconductor device having an etching stopper which causes no damage in the source/drain regions even if the misalignment of the mask occurs in the lithography and no etching-off of the silicon nitride film which becomes the etching stopper during the SAC method in the borderless device isolation region in creating the contact hole on the gate electrode covered by the silicon nitride film.

In other words, the present invention provides a method for manufacturing a semiconductor device, comprising steps of:

(a) forming a gate insulating film on a semiconductor substrate and forming a plurality of gate electrodes having a first insulating film made of a first insulating material thereon and a sidewall spacer made of the first insulating material on its sidewall on said gate insulating film;

(b) forming a second insulating film which is made of the first insulating material and which is thinner than said first insulating film on said semiconductor substrate at least in a region where a contact hole is to be formed in the later step;

(c) embedding a third insulating film which may become an etching stopper to etching of said first insulating material between said gate electrodes;

(d) forming a first resist pattern having a predetermined shape on said semiconductor substrate and etching said second insulating film, first insulating film and sidewall spacer until when said gate electrode is exposed by using said first resist pattern and said third insulating film as mask;

(e) forming an interlayer insulating film on said semiconductor substrate;

(f) forming a second resist pattern having a predetermined shape on said interlayer insulating film and exposing said second insulating film by etching using said second resist pattern as a mask; and (g) forming the contact hole by removing said second insulating film.

DESCRIPTION OF THE PREFERRED EMBODIMENTS

Figure 1A:
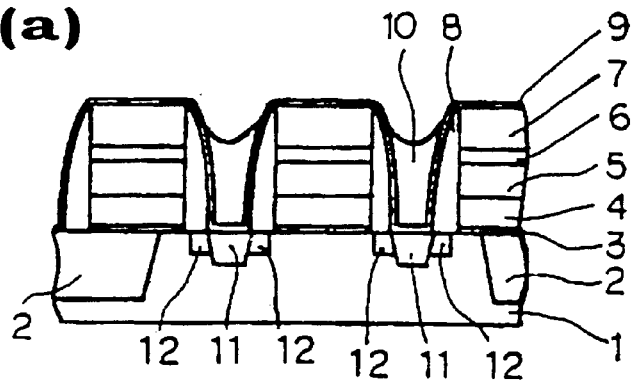
FIGS. 1(a) to FIG. 1(c) are section views of a location where a contact hole is positioned only on source/drain regions in a first half manufacturing step of a semiconductor device of a first embodiment of the present invention.

According to the method for manufacturing a semiconductor device, in step (a), a gate insulating film and a plurality of gate electrodes are formed on a semiconductor substrate at first. The gate insulating film and the gate electrode may be formed by the known method with materials and thickness used in manufacturing conventional semiconductor devices.

The gate electrode has a first insulating film made of a first insulating material thereon and a sidewall spacer made of the first insulating material on its sidewall. Here, the first insulating material is not limited to a specific material and it may be a silicon nitride or the like. The thickness of the first insulating film is about 100 nm to about 200 nm for example. The width of the sidewall spacer right above the semiconductor substrate is about 80 nm to about 150 nm for example. It is noted that the device isolation region is normally formed on the semiconductor substrate. Further, it is preferable to form an insulating film made of an insulating material different from the first insulating material on the gate electrode between the first insulating film. It becomes possible to prevent the damage which is otherwise caused by etching on the surface of the gate electrode even after when the first insulating film is removed in a later step. The thickness of the insulating film in this case is about 5 nm to about 20 nm for example.

In step (b), a second insulating film which is made of the first insulating material and which is thinner than the first insulating film is formed at least in the region on the semiconductor substrate where the contact hole is to be formed in the later step. Here, the region where the contact hole is to be formed in the later step means 1) only on the semiconductor substrate; 2) on the region extending from the semiconductor substrate to the device isolation region; 3) on the region extending from the semiconductor substrate to the gate electrode; and/or 4) on the region extending from the semiconductor substrate, the device isolation region and the gate electrode.

The second insulating film may be formed at least on the semiconductor substrate among the regions described above where the contact hole is to be formed. It may be formed on the whole surface of the semiconductor substrate thus obtained. The thickness of the second insulating film is about 30 nm to about 50 nm for example.

In step (c), a third insulating film which may become an etching stopper in etching the first insulating material is embedded between the gate electrodes. The third insulating film may become the etching stopper because the etching rate thereof is lower than that of the first insulating material in etching the first insulating material. The ratio of etching rates of the third insulating film/first insulating material is preferable to about 3 or more for example. The etching may be carried out by arbitrarily setting the conditions by the known etching method, e.g., the physical or chemical dry-etching method. The material of the third insulating film is not specifically limited and may be selected appropriately in connection with the first insulating material. For example, when the first insulating material is a silicon nitride, the third insulating film may be an SOG film, a silicon oxide film formed by a sub-normal pressure CVD method or a non-photosensitive organic film (anti-reflection coat: ARC, for instance).

While the third insulating film is embedded between the gate electrodes at least in the region where the contact hole is to be formed in the later step, the third insulating film may be embedded in the gaps of all gate electrodes depending on the third insulating film embedding method. The third insulating film may be embedded between the gate electrodes by forming the third insulating film on the whole surface of the semiconductor substrate by the known method and by exposing a part of the first insulating film and/or the second insulating film on the sidewall spacer by etching the third insulating film. It is noted that the third insulating film may be embedded between the gate electrodes by forming a first resist pattern in the next step after forming the third insulating film on the whole surface of the semiconductor substrate and by exposing a part of the first insulating film and/or the second insulating film on the sidewall spacer by etching the third insulating film by using the first resist pattern as a mask.

In step (d), the first resist pattern having a predetermined shape is formed on the semiconductor substrate thus obtained. The first resist pattern may be formed by the known method, e.g., photolithography and etching technique. It is noted that while the first resist pattern may have an opening in the region where the contact hole is to be formed and in the nearby region described above, it is preferable to have the opening only in the contact hole forming region.

Next, the second insulating film, the first insulating film and the sidewall spacer are etched until when the gate electrode is exposed by using the first resist pattern and the third insulating film as masks. It is preferable to carry out the etching by selecting a method which allows the first insulating material to be selectively etched.

It is noted that the third insulating film embedded between the gate electrodes may be removed after this step. Preferably, it is removed by selecting an etching method which allows only the third insulating film to be selectively etched by using the remaining second insulating film, the first insulating film and the sidewall spacer as masks. When the third insulating film is the non-photosensitive organic film, the third insulating film may be removed in removing the first resist pattern by means of ashing.

In step (e), an interlayer insulating film is formed on the semiconductor substrate thus obtained. Here, the interlayer insulating film is not limited to a specific film as long as it is an insulating film normally used in a semiconductor device. It may be a single or a laminated film of a silicon oxide film, a silicon nitride film, an SOG film, a PSG film, a BPSG film, a FSG film and the like for example. It is preferable to be the silicon oxide film in particular. The thickness of the interlayer insulating film is about 100 nm to about 200 nm for example.

In step (f), a second resist pattern having a predetermined shape is formed on the interlayer insulating film. The second resist pattern may be formed in the same manner with the first resist pattern. The second resist pattern may have an opening in the region where the contact hole is to be formed and in the nearby region. It is preferable to have the opening only in the contact hole forming region. It is noted that the shape of the second resist pattern may not coincide with that of the first resist pattern and misalignment is permitted.

Next, the second insulating film is exposed by etching using the second resist pattern as a mask. When the third insulating film has been removed in the previous step, the second insulating film may be exposed by removing only the interlayer insulating film in this etching. When the third insulating film has not been removed in the previous step, the second insulating film may be exposed by removing the interlayer insulating film and the third insulating film. Here, it is preferable to appropriately set a method and conditions which allow the interlayer insulating film and the third insulating film to be selectively etched arbitrarily with respect to the second insulating film in this etching.

In step (g), the second insulating film is removed. Preferably, the second insulating film is removed by appropriately setting a method and conditions which allow the second insulating film to be selectively etched with respect to the material of the gate electrode and the semiconductor substrate. The contact hole may be formed only on the semiconductor substrate between the gate electrodes, on the region extending from the semiconductor substrate to the device isolation region, on the region extending from the semiconductor substrate to the gate electrode and on the region extending from the semiconductor substrate, the device isolation region and the gate electrode for example.

First Embodiment

At first, a gate oxide film 3 of $SiO_2$, transistor gate electrodes 4 and 5 made of a refractory metal polycide film of a poly-crystalline Si film 4 and a refractory metal silicide layer 5 and silicon nitride films 7 and 8 covering the upper surface and side wall of the gate electrodes 4 and 5 are formed on the surface of an active region surrounded by a field insulating film on a semiconductor substrate 1 such as a P-type silicon substrate in which the device is isolated by selectively forming the field insulating film of $SiO_2$. Then, a silicon nitride film 9 which becomes an etching stopper film to the device isolation region during etching for SAC method is formed on the whole surface. The thickness of the silicon nitride film 7 is formed to be thicker than the silicon nitride film 9 so that the upper surface of the gate electrode will not be exposed during the etching for SAC method. Next, a non-photosensitive organic film 10 is filled in a groove between the gate electrodes by means of spin-coating of 1500 to 3000 rpm on the semiconductor substrate 1.

Figure 2A:
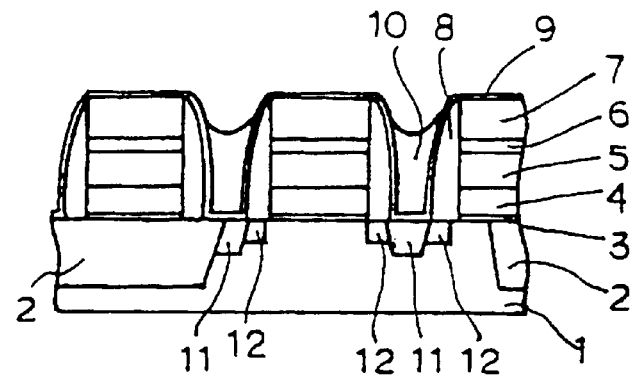
FIGS. 2(a) to FIG. 2(c) are section views of a location where a contact hole is positioned on source/drain regions and device isolation region in a first half manufacturing step of a semiconductor device of the first embodiment of the present invention.

At this time, the non-photosensitive organic film 10 is filled so that its height is lower than the upper surface of the silicon nitride film 9 covering the upper and side faces of the gate electrodes 4 and 5 (FIG. 1(a) and FIG. 2(a)).

Next, a resist pattern 21 which becomes a mask in dry-etching is formed by means of photolithography to remove the silicon nitride films 7 and 9 in the region where the gate electrodes 4 and 5 of the transistor is connected with the source/drain regions by one contact hole (shared contact hole) or in the region where the contact hole is formed on the gate electrodes 4 and 5.

Figure 1B:
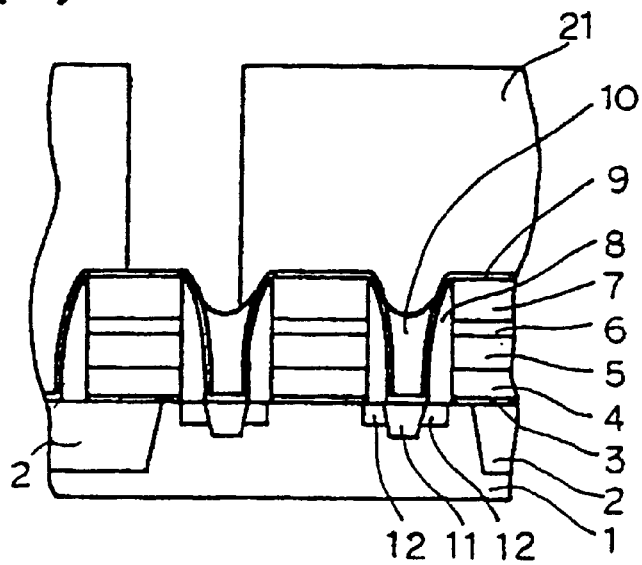
Figure 2B:
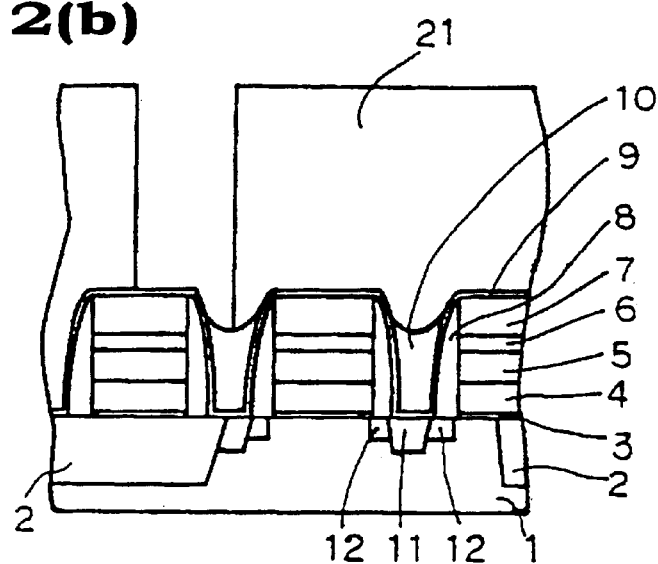

Because the organic film 10 is non-photosensitive, it is not developed by the photolithography and the state thereof filled in the groove between the gate electrodes 4 and 5 is kept at this time (FIG. 1(b) and FIG. 2(b)).

Next, the silicon nitride films 7, 8 and 9 are etched under the conditions which allow the selectivity to the non-photosensitive organic film 10, i.e., under the conditions of 50 to 100 mTorr of pressure, 400 to 800 W of RF power, $CHF_3:CF_4:Ar:O_2$=5 to 50:5 to 50:50 to 200:5 to 15 sccm of gas flow amount of mixed gas plasma by RIE method.

Figure 1C:
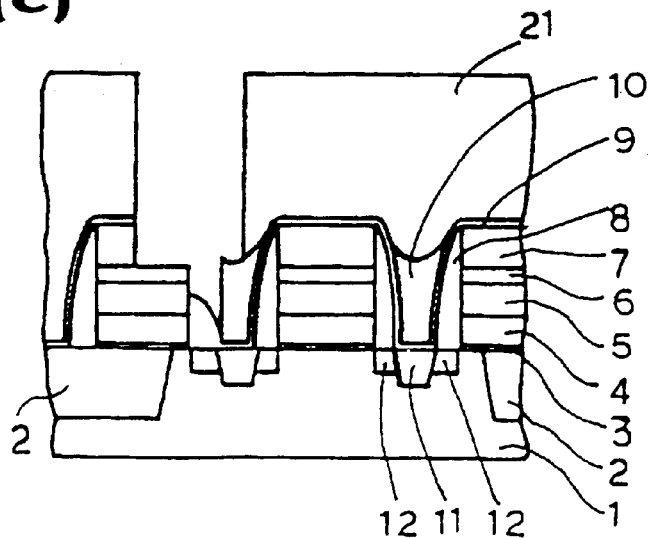
Figure 2C:
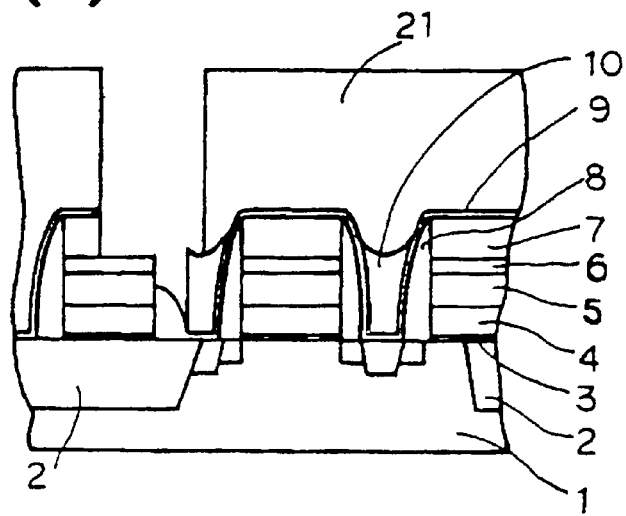

Even when a part of the resist pattern 21 extends over the source/drain regions 11 and/or 12 or the device isolation region 2 due to misalignment of the mask in the photolithography at this time, the organic film 10 becomes the etching stopper, thus causing no damage of the source/drain regions 11, 12, which is otherwise caused by the etching and no etching-off of the silicon nitride film 9 which becomes an etching stopper in the SAC method described later (FIG. 1(c) and FIG. 2(c)).

Figure 3A:
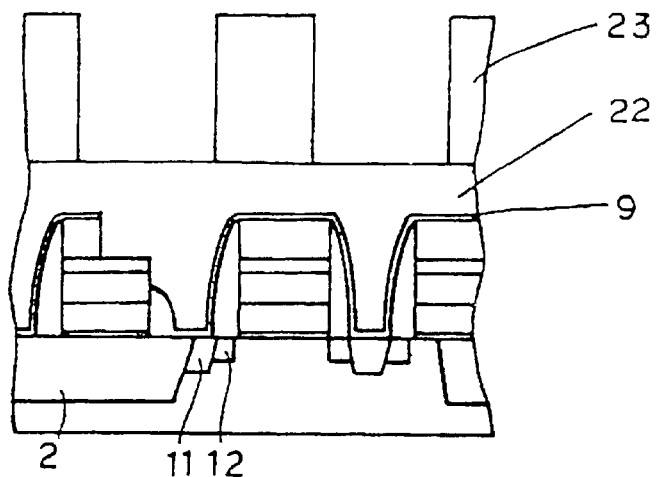
FIGS. 3(a) to FIG. 3(c) are section views of a location where a contact hole is positioned only on source/drain regions in a second half manufacturing step of a semiconductor device of the first embodiment of the present invention.

Then, even when the resist pattern 21 and the non-photosensitive organic film 10 are ashed by $O_2$ plasma, a silicon oxide film 22 is formed and the etching of oxide film (etching for SAC method) is carried out to the narrow source/drain regions 11 and 12 of the transistor and to the device isolation region 2 by using a resist pattern 23 for forming a borderless contact as a mask (FIG. 3(a)) and the silicon nitride films 7, 8 and 9 as etching stoppers, no large amount of loss of the silicon oxide film of the device isolation region 2 occurs because there is no etching-off of the silicon nitride film 9 which becomes the etching stopper of the etching for SAC method in the previous step.

Figure 3B:
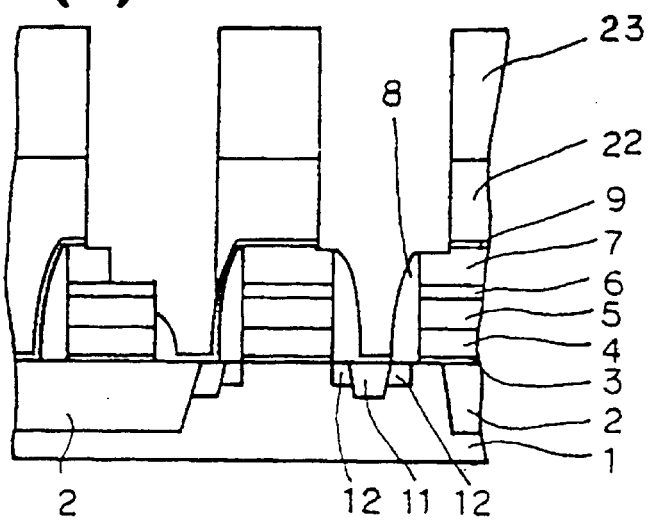
Figure 3C:
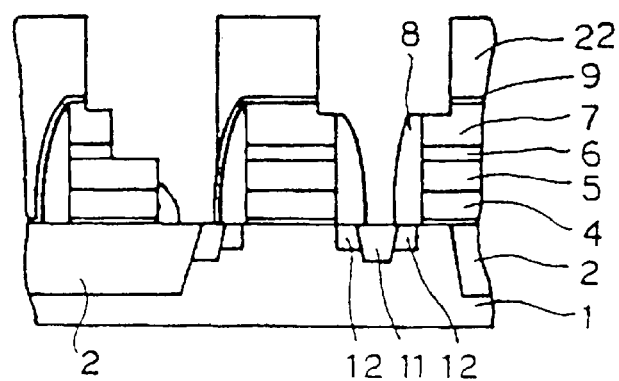

FIG. 3(b) is a section view after etching the oxide film of the interlayer insulating film in the SAC etching step and FIG. 3(c) is a section view after etching the silicon nitride film 9 which becomes a stopper layer in the SAC etching.

Second Embodiment

Figure 4A:
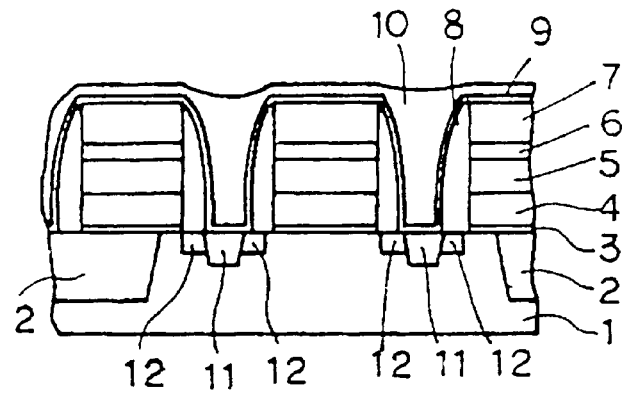
FIGS. 4(a) to FIG. 4(c) are section views of a location where a contact hole is positioned only on source/drain regions in a first half manufacturing step of a semiconductor device of a second embodiment of the present invention.
Figure 4B:
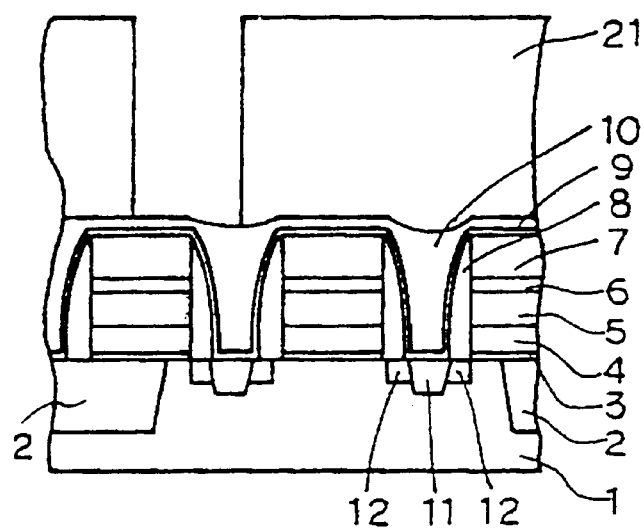
Figure 5A:
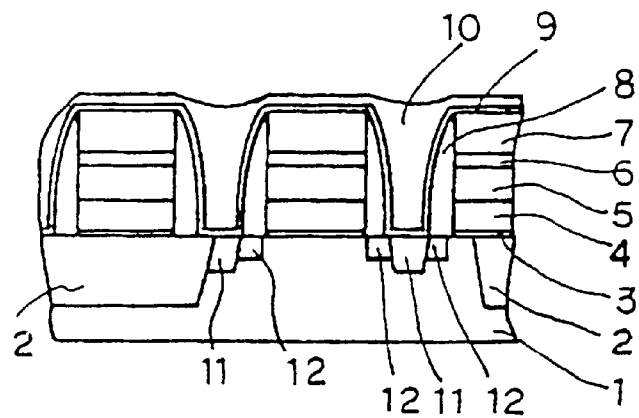
FIGS. 5(a) to FIG. 5(c) are section views of a location where a contact hole is positioned on source/drain regions and device isolation region in a first half manufacturing step of a semiconductor device of the second embodiment of the present invention.
Figure 5B:
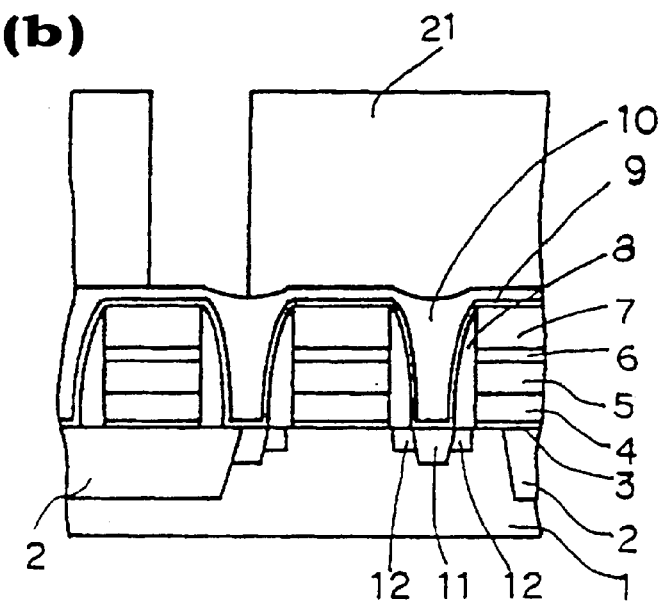

When the non-photosensitive organic film 10 filled in the groove between the gate electrodes is higher than the upper surface of the silicon nitride film 9 covering the upper and a side wall of the gate electrode in the first embodiment described above, the following conditions are used, as shown in FIG. 4(a) and FIG. 5(a), for dry-etching for removing the silicon nitride films 7 and 9 of the region where the gate electrode is connected with the source/drain regions 11, 12 of the transistor by one contact hole (shared contact hole) or the region where the contact hole is formed on the gate electrode.

Figure 4C:
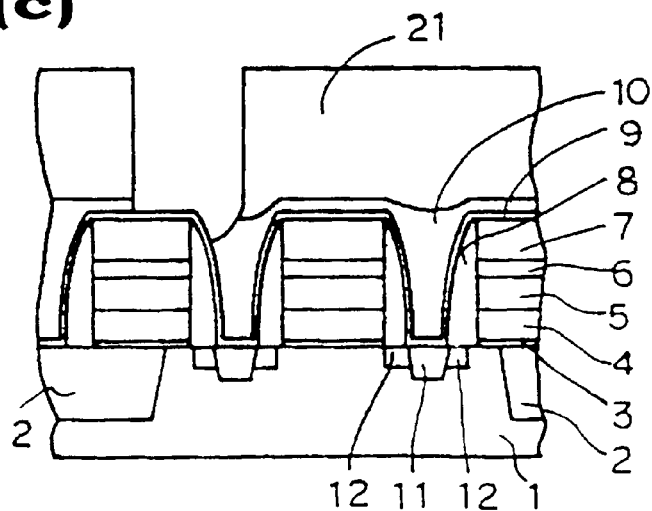
Figure 5C:
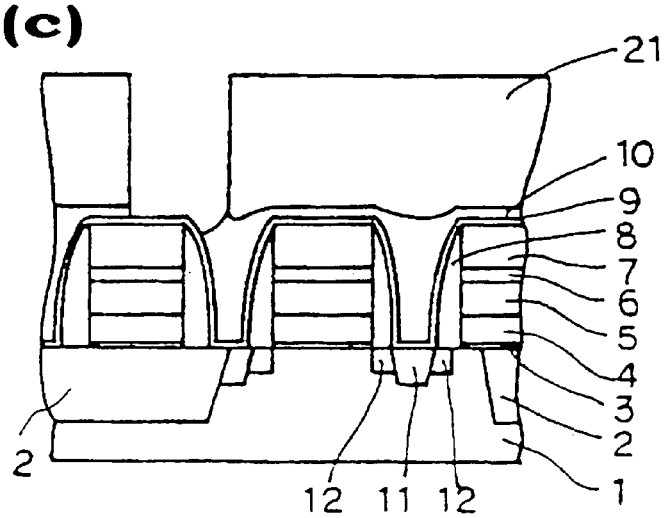
Figure 6A:
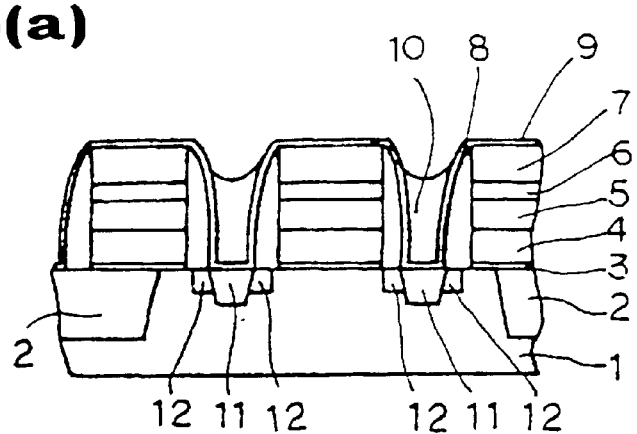
FIGS. 6(a) to FIG. 6(c) are section views of a location where a contact hole is positioned on source/drain regions and device isolation region in a first half manufacturing step of a semiconductor device of the second embodiment of the present invention.
Figure 6B:
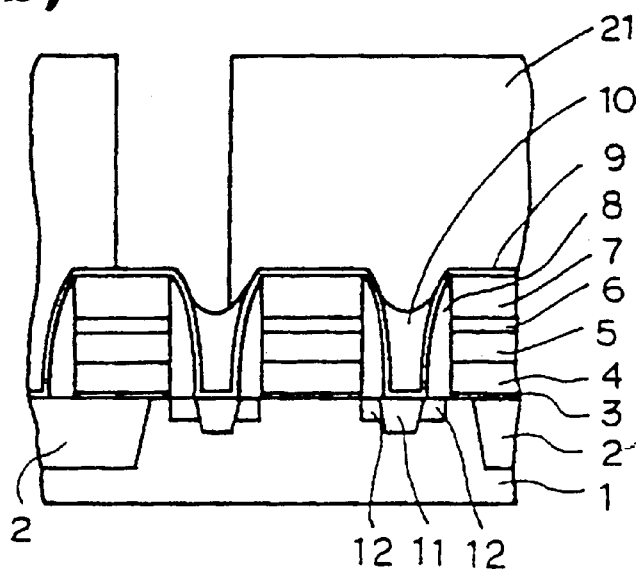
Figure 6C:
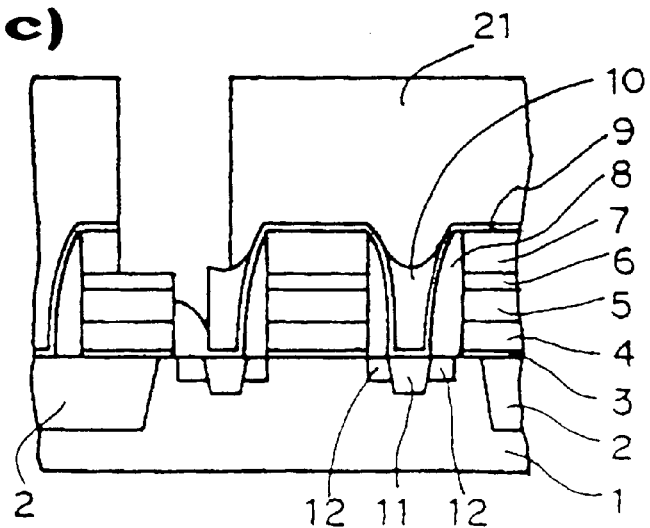
Figure 7A:
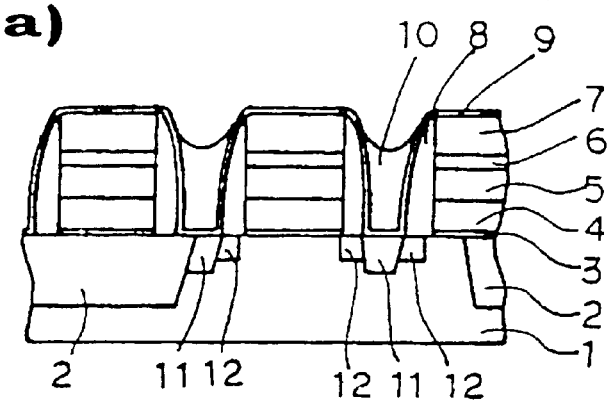
FIGS. 7(a) to FIG. 7(c) are section views of a location where a contact hole is positioned on source/drain regions and device isolation region in a first half manufacturing step of a semiconductor device of a third embodiment of the present invention.
Figure 7B:
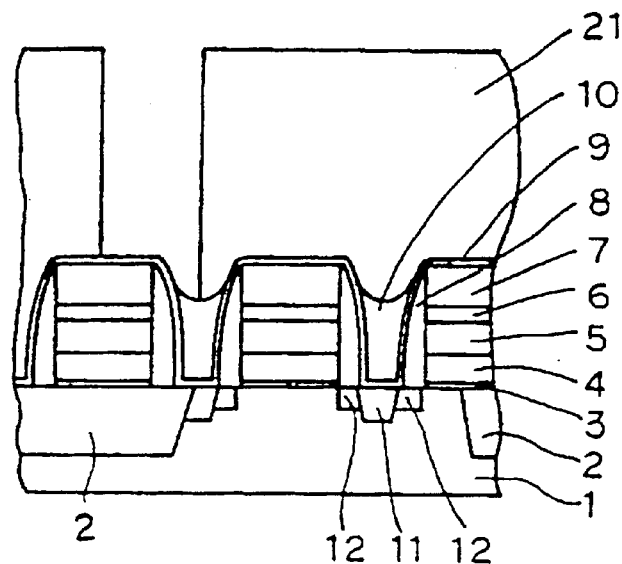
Figure 7C:
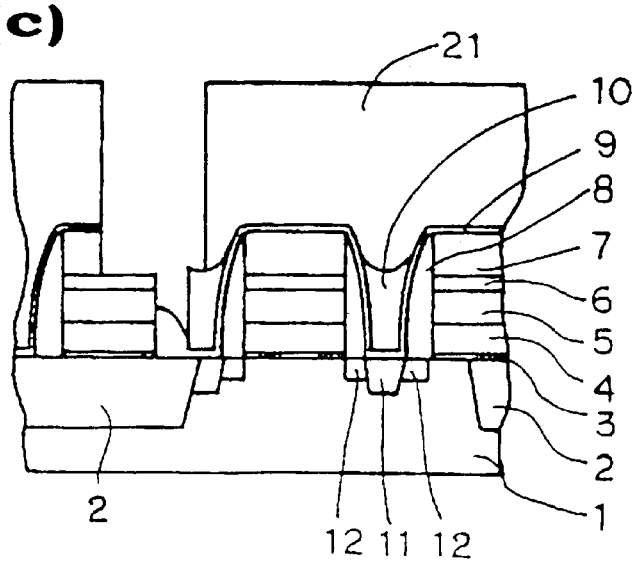
Figure 8A:
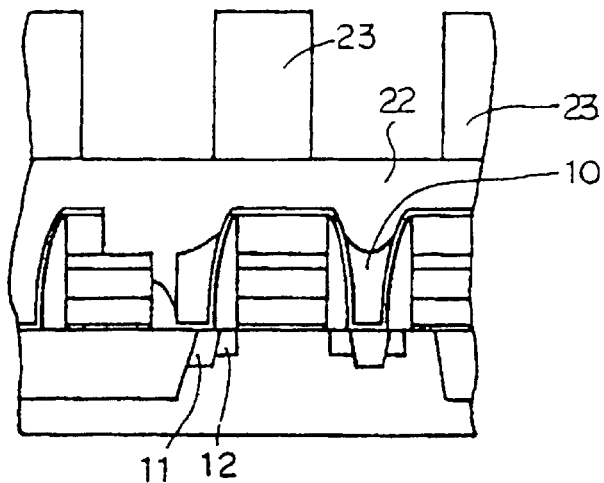
FIGS. 8(a) to FIG. 8(c) are section views of a location where a contact hole is positioned on source/drain regions and device isolation region in a first half manufacturing step of a semiconductor device of the third embodiment of the present invention.
Figure 8B:
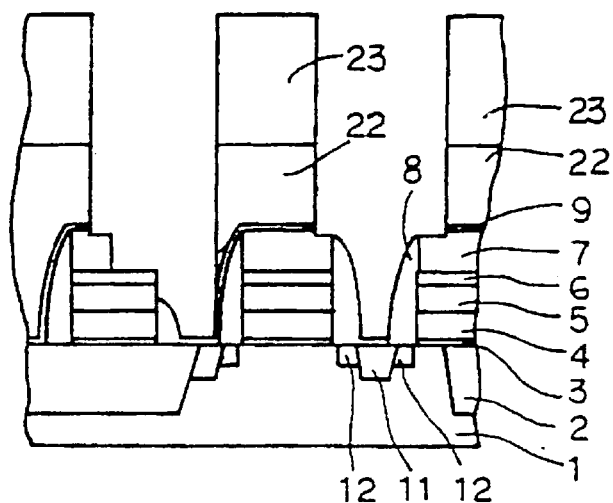
Figure 8C:
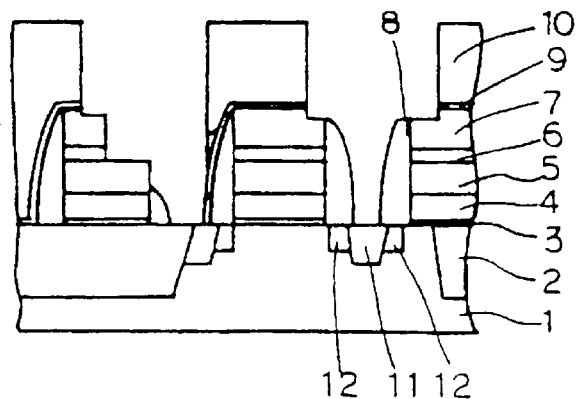
Figure 9A:
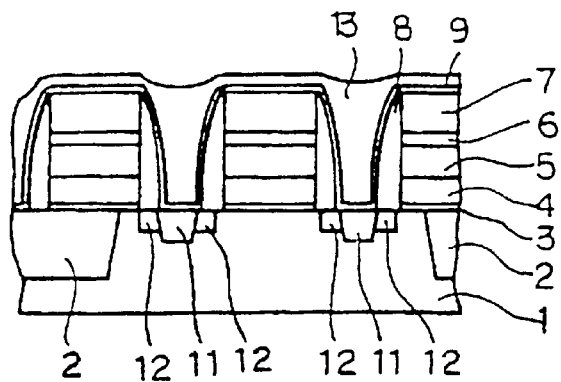
FIGS. 9(a) to FIG. 9(c) are section views of a location where a contact hole is positioned only on source/drain regions in a first half manufacturing step of a semiconductor device of a fourth embodiment of the present invention.
Figure 9B:
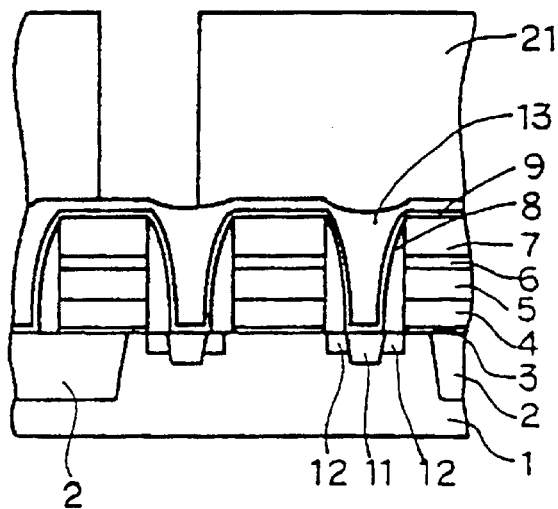
Figure 9C:
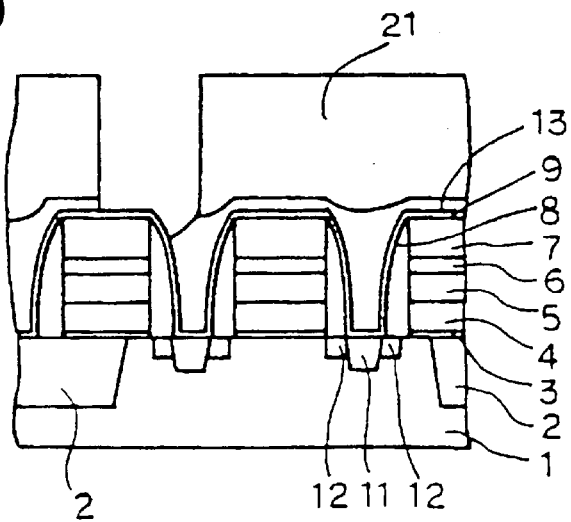
Figure 10A:
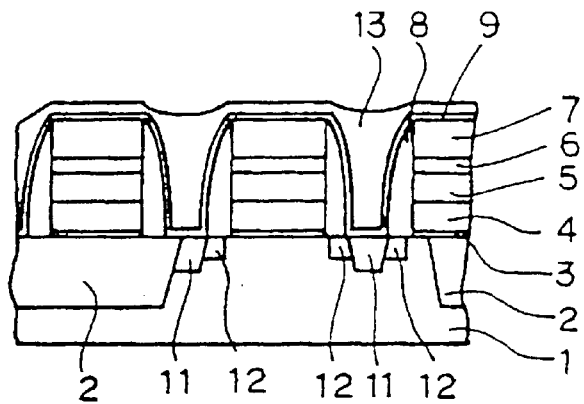
FIGS. 10(a) to FIG. 10(c) are section views of a location where a contact hole is positioned on source/drain regions and device isolation region in a first half manufacturing step of a semiconductor device of the fourth embodiment of the present invention.
Figure 10B:
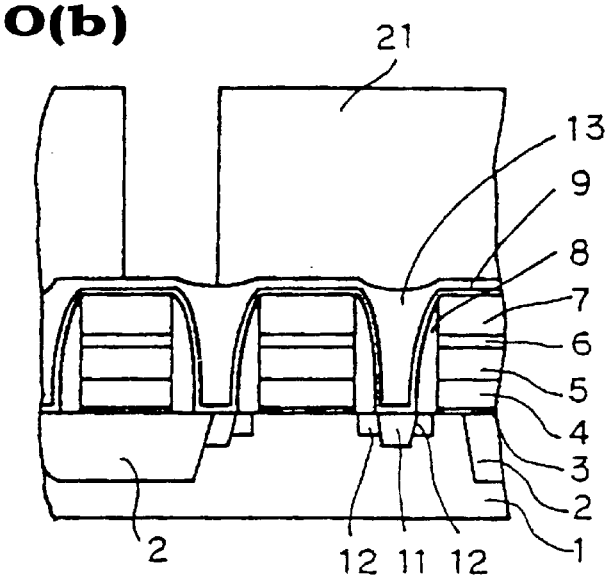
Figure 10C:
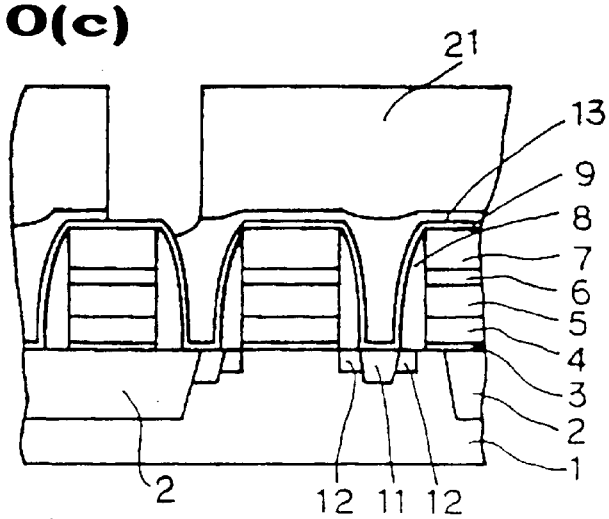
Figure 11A:
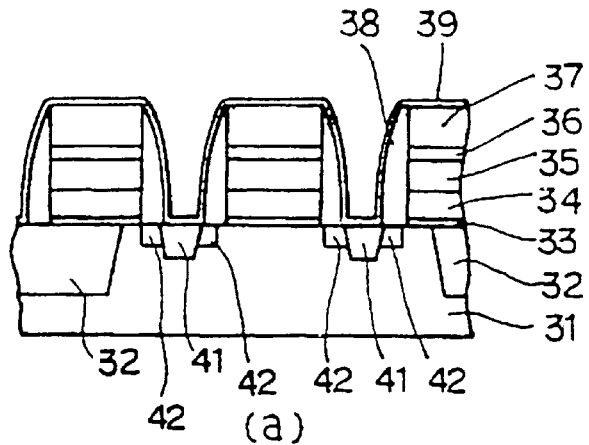
FIGS. 11(a) to FIG. 11(c) are section views of a semiconductor device according to the conventional manufacturing step.
Figure 11B:
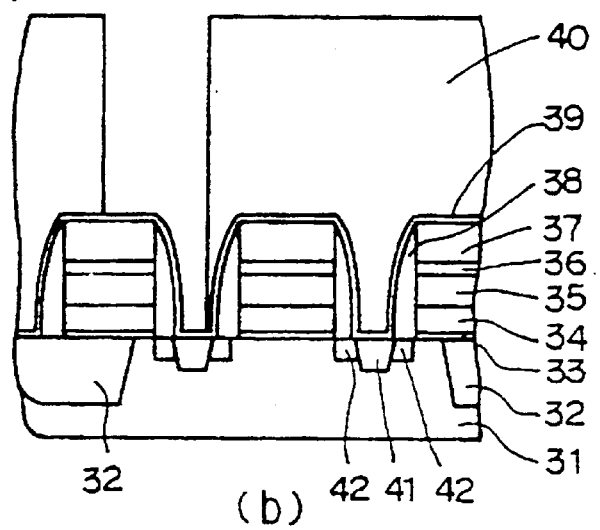
Figure 11C:
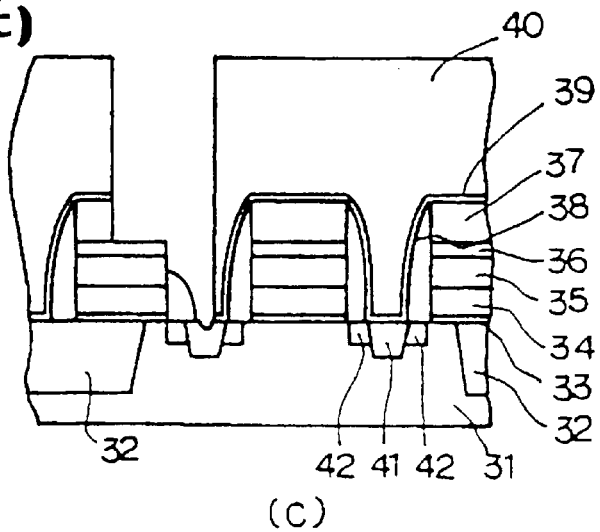
Figure 12A:
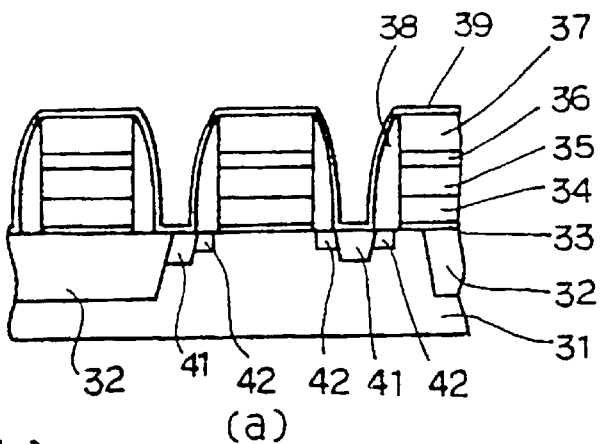
FIGS. 12(a) to FIG. 12(c) are section views of another semiconductor device according to the conventional manufacturing step.
Figure 12B:
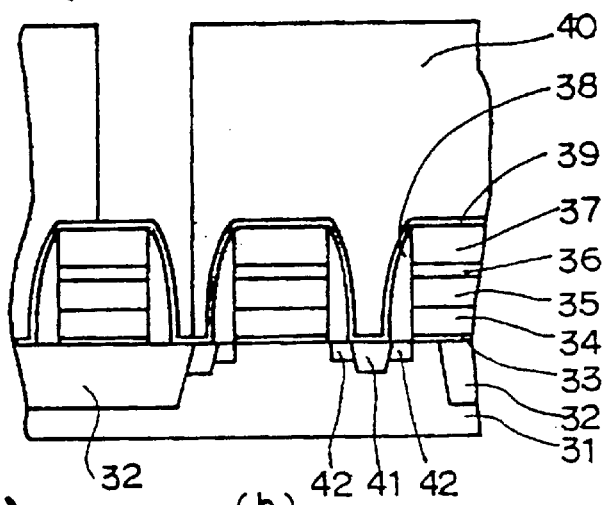
Figure 12C:
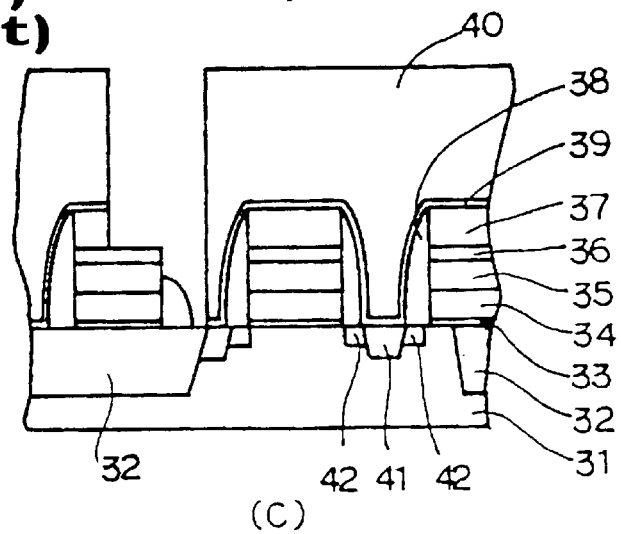
Figure 13A:
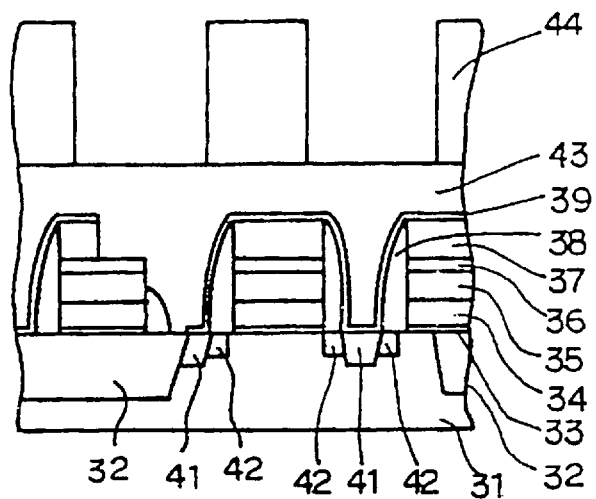
FIGS. 13(a) to FIG. 13(c) are section views of still another semiconductor device according to the conventional manufacturing step.
Figure 13B:
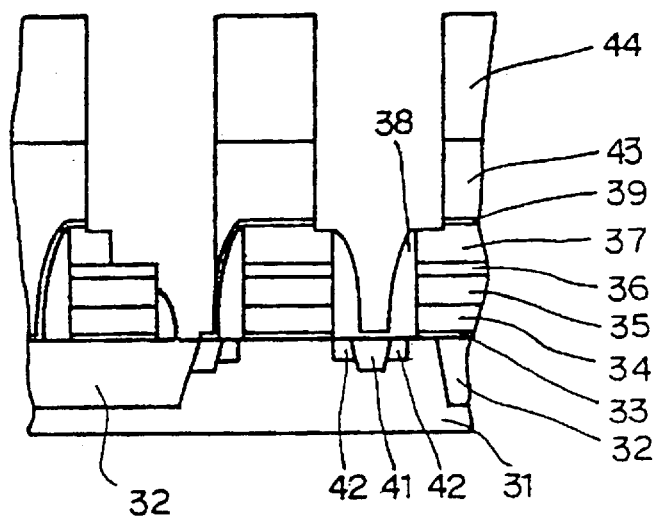
Figure 13C:
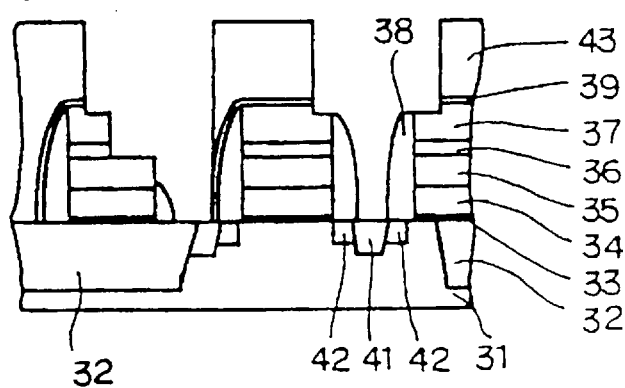

At first, the non-photosensitive organic film 10 formed above the upper surface of the silicon nitride film 9 covering the upper and side faces of the gate electrodes 4 and 5 is etched under the conditions which allows the selectivity with the silicon nitride film, i.e., 3 to 10 mTorr of pressure, 300 to 600 W of RF power and $Cl_2:O_2$=30 to 60:30 to 60 sccm of mixed gas plasma conditions in concrete (FIG. 4(c) and FIG. 5(c)). Then, the silicon nitride film is etched under the conditions shown in the first embodiment which allows the selectivity with the non-photosensitive organic film 10.

Even if the misalignment of the mask occurs in the photolithography and the etching is carried out in the state in which the part of the resist pattern 21 extends over the source/drain regions 11,12 or the device isolation region, the organic film 10 becomes the etching stopper, thus causing no damage of the source/drain regions 11,12 by the etching and no etching-off of the silicon nitride film which becomes the etching stopper in the etching for SAC method.

According to the invention, no damage occurs in the source/drain regions due to etching even if the misalignment occurs in the photolithography and the etching is carried out in the state in which a part of the resist mask pattern extends over the source/drain regions or the device isolation region by filling the silicon oxide film which is formed by the sub-normal pressure CVD method or the SOG film or non-photosensitive organic film 10 which is to be spin-coated in the groove between the gate electrodes to utilize as the etching stopper in dry-etching the silicon nitride film in the step of removing the silicon nitride film in the region where the gate electrode is connected with the source/drain regions of the transistor by one contact hole (shared contact hole) or in the region where the contact hole is formed on the gate electrode.

It also causes no etching-off of the silicon nitride film which becomes the etching stopper in opening the contact hole which is borderless with the device isolation region in the narrow source/drain regions of the transistor by means of the etching for SAC method. As a result, it can prevent a large amount of loss of the silicon oxide film in the device isolation region during the SAC method.

What is claimed is:

1. A method for manufacturing a semiconductor device, comprising steps of:
    (a) forming a gate insulating film on a semiconductor substrate and forming a plurality of gate electrodes having a first insulating film made of a first insulating material thereon and a sidewall spacer made of the first insulating material on its sidewall on said gate insulating film;
    (b) forming a second insulating film which is made of the first insulating material and which is thinner than said first insulating film on said semiconductor substrate at least in a region where a contact hole is to be formed in the later step;
    (c) embedding a third insulating film which may become an etching stopper to etching of said first insulating material between said gate electrodes;
    (d) forming a first resist pattern having a predetermined shape on said semiconductor substrate and etching said second insulating film, first insulating film and sidewall spacer until when said gate electrode is exposed by using said first resist pattern and said third insulating film as mask;
    (e) forming an interlayer insulating film on said semiconductor substrate;
    (f) forming a second resist pattern having a predetermined shape on said interlayer insulating film and exposing said second insulating film by etching using said second resist pattern as a mask; and
    (g) forming the contact hole by removing said second insulating film.

2. The method according to claim 1, wherein said third insulating film is embedded in the step (c) by forming said third insulating film on the whole surface of said semiconductor substrate and by exposing a part of said first insulating film and/or said second insulating film on said sidewall spacer.

3. The method according to claim 1, wherein said first insulating material is a silicon nitride.

4. The method according to claim 1, wherein said third insulating film is SOG film, a silicon oxide film formed by SOG or a sub-normal pressure CVD method or a non-photosensitive organic film.

5. The method according to claim 1, further comprising a step of removing said third insulating film embedded between said gate electrodes before the step (e).

6. The method according to claim 1, wherein said first resist pattern has an opening in the region and/or in the vicinity of the region where the contact hole is to be formed in the step (d).

7. The method according to claim 1, wherein said second resist pattern has an opening in the region and/or in the vicinity of the region where the contact hole is to be formed in the step (f).

8. The method according to claim 1, wherein said device isolation region is formed on said semiconductor substrate and the region where said contact hole is to be formed is a region only on said semiconductor substrate; on a region extending from said semiconductor substrate to said device isolation region; on a region extending from said semiconductor substrate to said gate electrode; or on a region extending from said semiconductor substrate to said device isolation region and said gate electrode.

* * * * *